United States Patent

[11] 3,597,696

[72] Inventor Karavattuveetil George Rabindran
Evanston, Ill.
[21] Appl. No. 856,984
[22] Filed Sept. 11, 1969
[45] Patented Aug. 3, 1971
[73] Assignee Vapor Corporation
Chicago, Ill.

[54] STABLE HIGH-GAIN SOLID STATE DC AMPLIFIER
7 Claims, 2 Drawing Figs.

[52] U.S. Cl. .......... 330/10,
330/9, 330/35, 330/24, 330/3
[51] Int. Cl. .......... H03p 3/38,
H03g 3/16
[50] Field of Search .......... 330/10, 9

[56] References Cited
UNITED STATES PATENTS

| | | | |
|---|---|---|---|
| 3,454,887 | 7/1969 | Gebo | 330/10 |
| 3,510,684 | 5/1970 | Martin | 330/10 X |
| 3,518,564 | 6/1970 | Games et al. | 330/10 |

OTHER REFERENCES

IBM Technical Disclosure Bulletin - Vol. 10, No. 3, Aug. 1967 - "Floating Input Preamplifier" by C. A. Walton - pp. 346— 347 330/35

*Primary Examiner*—Nathan Kaufman
*Attorneys*—Julian Falk, Chester A. Williams, Jr., Marshall J. Breen and Kinzer, Dorn & Zickert

ABSTRACT: A stable high-gain solid-state DC amplifier circuit comprising a low-pass filter connecting a DC supply to an input chopper (either shunt or series connected) that is AC coupled to a high-gain noninverting AC amplifier; the amplifier is in turn AC coupled to an output chopper (again, either series or shunt connected) connected to a storage capacitor, with a negative feedback circuit from the storage capacitor back to the low-pass filter in the input of the input chopper. The two choppers are driven in effective phase opposition, relative to each other, so that the feedback loop is not completely closed at any instant. For improved gain, the combination of a series chopper and a shunt chopper may be used at either end, or at both ends, of the amplifier circuit.

INVENTOR
KARAVATTUVEETIL GEORGE RABINDRAN

BY

ATTORNEY

STABLE HIGH-GAIN SOLID STATE DC AMPLIFIER

BACKGROUND OF THE INVENTION

High-gain DC amplifiers have a wide range of application, particularly in the field of instrumentation and controls. But there are a number of difficult problems often presented in conjunction with DC amplifiers having appreciable gain. Input drift is a frequent source of inaccuracy in operation of amplifiers of this kind. Another source of error, particularly where the DC signal is first inverted to AC and then amplified and subsequently converted back to DC, if variable attenuation in the choppers or like devices employed for signal inversion. Perhaps the most difficult problem presented by high-gain DC amplifiers is an inherent tendency toward oscillation.

SUMMARY OF THE INVENTION

It is a principal object of the invention, therefore, to provide a new and improved high-gain solid state DC amplifier circuit that is inherently stable and accurate in its operation.

A specific object of the invention is to provide a new and improved stabilized high-gain solid state DC amplifier in which oscillation is positively prevented.

Another object of the invention is to provide a new and improved stabilized high-gain solid state DC amplifier that effectively eliminates input drift and that has a high rate of recovery from disturbances that may cause amplifier bias drift.

A further object of the invention is to provide a new and improved stabilized high-gain solid DC amplifier in which amplification is carried out on an AC basis and that effectively minimizes or eliminates variations in attenuation occurring in the choppers employed for inversion from DC to AC.

Accordingly, the invention relates to a stable high-gain solid state DC amplifier circuit having an input terminal connected to a DC signal source and having an output terminal, the circuit comprising input chopper means, connected to the input terminal, for developing a pulsating intermediate signal that varies in amplitude with changes in amplitude of the DC input signal. The intermediate signal is applied to the input of a high-gain noninverting AC amplifier which develops an amplified intermediate signal; AC coupling is employed. A second AC coupling means is utilized to apply the amplified intermediate signal to an output chopper means that is connected to the output terminal of the circuit. A negative feedback circuit connects the output terminal back to the input terminal of the DC amplifier circuit. Both of the chopper means are actuated by a common chopper drive means at a given frequency but in effective phase opposition relative to each other so that the feedback loop is not completely closed at any instant.

DESCRIPTION OF THE PREFERRED EMBODIMENT

Figure 1:
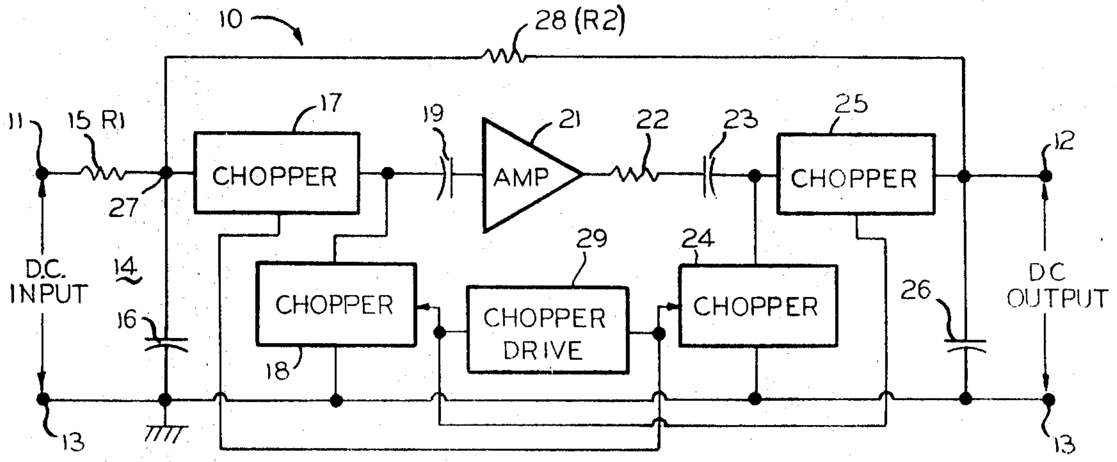
FIG. 1 is a simplified block diagram, partly schematic, of a stable high-gain solid state DC amplifier circuit constructed in accordance with the present invention.

FIG. 1 illustrates a stable high-gain solid state DC amplifier circuit 10 constructed in accordance with the invention; amplifier circuit 10 has an input terminal 11 and an output terminal 12. At the input of amplifier circuit 10, input terminal 11 and a common terminal 13 are connected to a suitable source of a low-amplitude DC signal (not shown). The output of amplifier circuit 10 is taken across output terminal 12 and common terminal 13.

The input of amplifier circuit 10 comprises a low pass filter circuit 14 including a series resistor 15 that is connected to input terminal 11 and a filter capacitor 16 that is connected from resistor 15 to common terminal 13. In FIG. 1, common terminal 13 is indicated as being connected to system ground but it should be understood that no ground connection is essential.

Amplifier circuit 10 further comprises input chopper means, illustrated in FIG. 1 as including a series-connected chopper 17 and a shunt-connected chopper 18. Chopper 17 has an input connection to input terminal 11 through resistor 15; the chopper output is connected to a coupling capacitor 19 that is in turn connected to a high-gain noninverting AC amplifier 21. The other input chopper 18 is connected from the output of chopper 17 to series ground. Thus, capacitor 19 constitutes a first AC coupling means that couples input choppers 17 and 18 to the input of amplifier 21. Either chopper 17 or chopper 18 can be replaced by a resistance, as explained more fully hereinafter, but use of at least one of these choppers is necessary to the invention.

The output of amplifier 21 is connected to a second AC coupling means comprising a series resistor 22 and a capacitor 23. This second AC coupling circuit couples the output of amplifier 21 to an output chopper means shown in FIG. 1 as including both a shunt-connected chopper 24 and a series-connected chopper 25. Thus, the shunt chopper 24 is connected from the output side of capacitor 23 to system ground whereas the other output chopper 25 is connected from capacitor 23 to the output terminal 12 of the amplifier circuit. As in the case of the input chopping means, either one of the output choppers 24 or 25 can be replaced by a resistance, depending upon the gain required from amplifier circuit 10, but at least one of the choppers must be present.

A storage capacitor 26 is incorporated in the output circuit of amplifier circuit 10 and is connected between output terminal 12 and the system ground terminal 13. A feedback circuit is connected from output terminal 12 back to the input terminal of amplifier circuit 10, the actual input connection being made at the junction 27 of resistor 15, capacitor 16 and the input to chopper 17. This negative feedback circuit includes a series resistor 28.

Amplifier circuit 10 further comprises a chopper drive circuit 29 for actuating all of the choppers 17, 18, 24 and 25. The connections from chopper drive 29 to the individual chopper circuits are such that choppers 17 and 24 are actuated in phase synchronism with each other but in 180° phase displacement with respect to the drive for choppers 18 and 25. This relationship is of substantial importance to the operation of amplifier circuit 10, as described in detail hereinafter. The cut off frequency for low-pass filter 14 should be about one-half the operating frequency of chopper drive circuit 29, or lower.

In operation of amplifier circuit 10, a low-amplitude DC input signal supplied to low-pass filter 14 through input terminals 11 and 13 is applied to the input of chopper 17. Chopper 17 is alternately driven conductive and nonconductive by a gate signal from circuit 29, and develops a pulsating intermediate signal that varies in amplitude with changes in amplitude of the DC input signal. It is this intermediate signal that is applied to the input of amplifier 21 by the first AC coupling means comprising capacitor 19.

As indicated above, the shunt chopper 18 is actuated by a gate signal from circuit 29 that is of the same frequency as the gate signal supplied to the series chopper 17. Whenever chopper 17 is gated to its conductive condition, chopper 18 is driven nonconductive, and vice versa. It can thus be seen that either of the two input choppers 17 and 18 can be utilized effectively to invert the DC input signal and develop the desired pulsating intermediate signal for input to amplifier 21. Consequently, either of the two choppers 17 and 18 can be replaced by a fixed resistor, but one of the two choppers must be present for effective operation of the invention. The combination of two choppers illustrated in FIG. 1 makes it possible to realize somewhat higher gain from amplifier circuit 10 without sacrifice of stability in operation.

The intermediate signal from input chopping means 17, 18 is amplified in amplifier 21. Amplifier 21 may include any desired number of stages, but should be a noninverting amplifier so that the amplified intermediate signal developed at the output of amplifier 21 has the same polarity characteristics as the input signal, although there is no DC reference because AC coupling is used for amplifier 21. The amplified intermediate signal from amplifier 21 is supplied to the output terminals 12 and 13 of the amplifier, being converted again to a DC signal by means of the storage and filter capacitor 26. Moreover, the amplified DC signal is fed back to the input of amplifier 10 through the negative feedback circuit comprising resistor 28.

In the output portion of amplifier circuit 10, the series chopper 25 is driven between alternate conductive and nonconductive conditions by the gating signal supplied to the chopper from chopper drive circuit 29. The phase relationship for the gate signal that drives series chopper 25, as compared with the drive signal applied to the input series chopper 17, is one of 180° phase displacement. Thus, when the series input chopper 17 is driven conductive by the gating signals, the series output chopper 25 is driven nonconductive. Similarly, the shunt chopper 24 in the output circuit is driven conductive whenever chopper 17 is conductive and is driven nonconductive when the input chopper is nonconductive. These relationships are reversed, when a comparison is made between the output choppers 24 and 25 and the input shunt chopper 18. That is, when the input shunt chopper 18 is conductive, the output series chopper 25 is conductive and the output shunt chopper 24 is nonconductive. Conversely, when the input shunt chopper 18 is nonconductive, the output shunt chopper 24 is conductive and the output series chopper 25 is nonconductive.

From the foregoing description of the operational relationships between the input chopper means 17, 18 and the output chopper means 24, 25, and considering that both are driven from the same chopper drive circuit 29, it can be seen that the input chopper means and the output chopper means are both actuated at a given frequency but in effective phase opposition relative to each other. When the series input chopper 17 is conductive and the shunt input chopper 18 is nonconductive, so that an input current is supplied to amplifier 21, the series output chopper 25 is open circuited and the output chopper 24 is conductive. The reverse relationship also holds true, so that the feedback loop comprising resistor 28 is not completely closed at any given instant.

At any given instant, if the input signal voltage across the input capacitor 16 has some amplitude other than zero, the intermediate signal supplied to amplifier 21 will be a pulsating voltage of rectangular wave form having an amplitude determined by the amplitude of the voltage across capacitor 16. With this input, amplifier 21 and output chopper means 24, 25 produce an output voltage, applied to capacitor 26, that tends to decrease the magnitude of the voltage across capacitor 16, by virtue of the feedback connection afforded by resistor 28. It can be demonstrated that the steady state output voltage $Eo$ across capacitor 26, which is also the output voltage between terminals 12 and 13, is related to the steady state input voltage $Ei$ across terminals 11 and 13 as follows:

$$(1)\qquad \frac{Eo}{Ei}=\frac{R^2/R^1}{1+(R^2/R^1)/A}$$

, in which $A$ is the overall gain of amplifier 21, as modified by the attenuation introduced by choppers 17, 18, 24 and 25, $R1$ is the resistance of the input resistor 15, and $R2$ is the resistance of the feedback resistor 28.

If the gain of amplifier 21 is high enough so that $$(2)\ A >> R2/R1,$$

then $$(3)\ (Eo/Ei)\approx(R2/R1).$$

The conditions represented by equations (1), (2) and (3) provide the desired stability and accuracy in operation of amplifier circuit 10.

The desired inherent stability for amplifier 10 is achieved by operating the input choppers 17 and 18 effectively 180° out of phase with respect to the output choppers 24 and 25 as described above, so that the feedback loop is not completely closed at any given instant. This eliminates the possibility of oscillation, in amplifier circuit 10, a condition commonly encountered in any high-gain feedback amplifier with even a very small amount of lag in its operation. Since any low-pass filter inevitably introduces some lag, it can be seen that the described circuit affords substantial advantages in comparison with any circuit in which the feedback loop is completely closed for even extremely limited periods of time.

In the operation of DC amplifier circuit 10, input chopping is required to overcome the drift characteristics of amplifier 21, whereas output chopping and filtering are necessary to restore a DC level to the output signal. This filtering inevitably introduces some lag. The feedback circuit must include both of the input and output chopper means and the output filter comprising capacitor 26 (not just amplifier 21) in order to prevent errors that might otherwise be introduced by variations in the attenuation presented in the circuit by the choppers and the output filter. The open-loop gain of the amplifier must be very high in order to maintain the relationship set forth above in equation (3). With both high gain and lag present, the feedback circuit would inevitably cause oscillation, but this is prevented by actuating the input and output chopper means with an effective 180° phase displacement. In addition, the recovery of circuit 10 from disturbances that might cause bias drift in amplifier 21 are more rapid than in conventional circuits because the filters incorporated in circuit 10 remove only frequencies that are of the same order as or higher than the chopper drive frequency.

Figure 2:
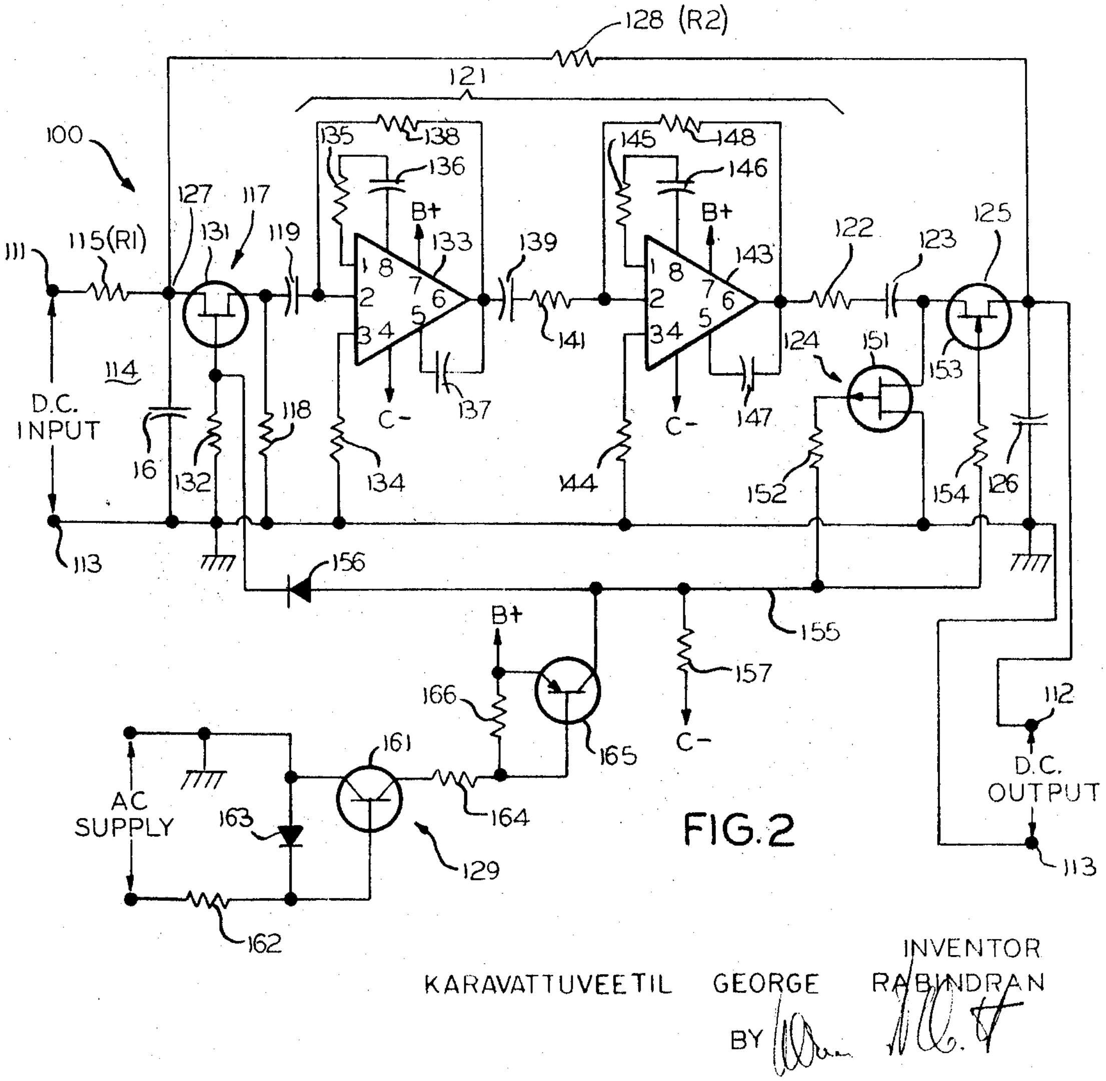
FIG. 2 is a detailed circuit diagram of a specific DC amplifier circuit constructed in accordance with a preferred embodiment of the present invention.

FIG. 2 illustrates a high gain DC amplifier circuit 100 that constitutes a specific example of the amplifier circuit 10 of FIG. 1. In FIG. 2, elements of amplifier circuit 100 that correspond to those described above for circuit 10 bear the same reference numerals except that they have been increased by a factor of one hundred.

Amplifier circuit 100 has an input terminal 111, an output terminal 112, and a common terminal 113 shown connected to system ground. The input circuit is a low-pass filter 114 comprising a series resistor 115 connected to input terminal 111 and a shunt capacitor 116 connected from resistor 115 to the ground terminal 113.

In amplifier circuit 100, the input chopping means is a single series chopper circuit 117. Chopper 117 comprises a field effect transistor 131 having one main electrode connected to the junction 127 of resistor 115 and capacitor 116. The other main electrode of transistor 117 is connected to a coupling capacitor 119. The gate electrode of transistor 117 is connected to a resistor 132 that is returned to ground terminal 113. The gate electrode is also connected to a diode 156 that is a part of a chopper drive circuit 129 described more fully hereinafter.

In amplifier circuit 100, only the one chopper 117 is used for the input chopping means. The shunt chopper 18 of the previously described circuit is replaced by a fixed resistor 118.

The main amplifier portion of amplifier circuit 100 is a two-stage AC amplifier 121. The first stage of amplifier 121 is an operational amplifier 133 having its input electrode connected to the AC coupling capacitor 119. Operational amplifier 133 is an eight-pin device with the third pin connected to a bias resistor 134 that is returned to ground terminal 113. The fourth and seventh pins are connected to DC supplies designated as C− and B+respectively. The first and eighth pins are interconnected by a series resistance-capacitor circuit comprising a resistor 135 and a capacitor 136. The sixth (output) pin of operational amplifier 133 is connected to the fifth pin by a capacitor 137, and is also connected back to the input of the device by a feedback resistor 138.

The second stage of amplifier 121 is an operational amplifier 143. The input electrode for the operational amplifier, on the second pin, is connected to the output of the preceding operational amplifier 133 by a series coupling circuit comprising a capacitor 139 and a resistor 141. The circuit connections for amplifier 143 are the same as the amplifier 133. Thus, the third pin of operational amplifier 143 is connected to system ground by a resistor 144. The fourth and seventh pins are connected to the C− and B+ supplies, respectively. A series resistor 145 and capacitor 146 interconnect the first and eighth pins. The sixth or output pin of operational amplifier 143 is connected back to the input electrode by a feedback resistor 148 and is coupled to the fifth pin by a capacitor 147.

The AC output coupling circuit for amplifier 121 includes a resistor 122, connected to the output electrode of operational amplifier 143, and a series coupling capacitor 123. As in the previously described embodiment, two output choppers are utilized, these being a shunt chopper 124 and a series chopper 125.

The shunt output chopper 124 includes a field effect transistor 151 having one main electrode connected to the output side of coupling capacitor 123. The other main electrode of transistor 151 is connected to system ground. The gate electrode of transistor 151 is connected, by a resistor 152, to a conductor 155 that is a part of chopper drive circuit 129. It should be noted that transistor 151 is of the same conductivity type as the input chopper transistor 131.

The series output chopper 125 comprises a field effect transistor 153 having one main electrode connected to the output side of coupling capacitor 123 and having its other main electrode connected to output terminal 112. The gate electrode of transistor 153 is connected through a resistor 154 to the conductor 155 in drive circuit 129. As before, the output circuit of the DC amplifier includes a storage and filter capacitor 126 connected across output terminals 112 and 113. A negative feedback circuit comprising a resistor 128 is connected from output terminal 112 back to the input of the amplifier at junction 127.

The chopper drive circuit 129, in FIG. 2, comprises a first transistor 161 having its emitter electrode connected to system ground, shown as one terminal of an AC supply. The base electrode of transistor 161 is connected to a resistor 162 that is returned to the other terminal of the AC supply. The AC supply may comprise a conventional 60 Hz. source, although other frequencies can be used as desired. A diode 63 is connected between the emitter and the base of transistor 161.

The collector of transistor 161 is connected to an output resistor 164 that is in turn connected to the base of a second transistor 165. The emitter of transistor 165 is connected to the B+ supply. A bias resistor 166 is connected between the emitter and the base of transistor 165. The collector of transistor 165 is connected to the conductor 155 that leads to the gate electrodes of the three choppers in amplifier circuit 100, and is also connected, through a bias resistor 157, to the C−supply.

The operation of the stabilized high-gain DC amplifier circuit 100 of FIG. 2 is essentially identical to that described above for the amplifier circuit 10 of FIG. 1; accordingly a detailed description of the circuit operation is deemed unnecessary. As before, an input DC signal *Ei* is supplied to the input chopper 117 and is inverted, by the chopper, to afford a 60 Hz. pulsating intermediate signal that is AC coupled to the two-stage amplifier 121 by coupling capacitor 119. Chopper transistor 131 is driven alternately conductive and nonconductive by the 60Hz. signal supplied to the transistor from drive circuit 129 through diode 156. The amplified AC signal from amplifier 121 is again supplied to choppers 124 and 125 and is converted to a DC output signal at the storage and filter capacitor 126. It may be observed that the circuit arrangement is such that the shunt output chopper 124 is conductive whenever the input chopper 117 is conductive whereas the series output chopper 125 is cut off whenever the input chopper conducts. The two chopper transistors 151 and 153 are actuated by the same drive signal from circuit 129 but with opposite results as regards conduction state due to the fact that the two transistors are of opposite conductivity types. The relationships of equations (1) through (3) all apply.

In order to afford a more complete example of the present invention, detailed circuit parameters for amplifier circuit 100 (FIG. 2) are set forth hereinafter. It should be understood that this information is presented solely by way of example and in no sense as a limitation on the present invention.

TABLE OF CIRCUIT PARAMETERS, CIRCUIT 100

| | |
|---|---|
| **RESISTORS** | |
| 115 (R1) | 1,000 ohms |
| 128 (R2) | 232 kilohms |
| 118 | 12 kilohms |
| 122 | 1.5 kilohms |
| 132, 138, 152, 154 | 1 megohm |
| 134, 144, 157, 166 | 10 kilohms |
| 135, 141, 145 | 2.2 kilohms |
| 148 | 470 kilohms |
| 162 | 100 kilohms |
| 164 | 27 kilohms |
| **CAPACITORS** | |
| 116 | 100 microfarads |
| 119, 123, 139 | 10 microfarads |
| 126 | 270 microfarads |
| 136 | 470 micro microfarads |
| 137,147 | 47 micro microfarads |
| 146 | 4,700 micro microfarads |
| **SEMICONDUCTOR DEVICES** | |
| 131,151 | 2N5460 |
| 153 | MPF106 |
| 161 | 2N3566 |
| 165 | 2N4402 |
| 156,163 | 2N914 |
| 133,143 | μA7709C |
| **VOLTAGE SUPPLIES** | |
| B+ | +10 volts |
| C− | −10 volts |
| AC Supply | 24 volts, 60 Hz. |

The DC amplifier circuits of the present invention, described above, effectively eliminate drift problems even though constructed with inexpensive solid state components; precision matching of components is not required. At the same time, the circuits of the invention afford inherent high closed loop stability, from DC input to DC output, despite the provision of very high open loop gain. The dual chopper construction used for the output chopping means, in FIG. 2, allows an increase in gain, as compared with a circuit in which either chopper 124 or chopper 125 is replaced by a fixed resistor, of the order of two to one.

I claim:

1. A stable, high-gain solid state DC amplifier circuit having an input terminal connectable to a DC signal source, and having an output terminal, comprising:

input chopper means, connected to said input terminal, for developing a pulsating intermediate signal varying in amplitude with changes in amplitude of a DC signal applied to said input terminal;

a high-gain noninverting AC amplifier having an input and an output;

first AC coupling means, coupled to said input chopper means, for applying said intermediate signal to the input of said AC amplifier, said AC amplifier developing an amplified intermediate signal at its output;

output chopper means, connected to said output terminal second AC coupling means, coupled to the output of said AC amplifier, for applying said amplified intermediate signal to said output chopper means;

negative feedback circuit connecting said output terminal back to the input of said input chopper means;

and chopper drive means, coupled to said input chopper means and said output chopper means, for actuating both of said chopper means at a given frequency but in effective phase opposition relative to each other so that the feedback loop is not completely closed at any given instant;

at least one of said chopper means comprising both a series-connected chopper and a shunt-connected chopper, both connected to the same terminal of the amplifier circuit.

2. A stable, high-gain solid state DC amplifier circuit according to claim 1 in which the input to said input chopper means comprises a low-pass filter having a cutoff frequency below said given frequency.

3. A stable, high-gain solid state D.C. amplifier circuit according to claim 2 in which said low-pass filter includes a series resistance $R1$, said feedback circuit has a series resistance $R2$, and said amplifier and said chopper means have a total gain $A$, and in which $$A >> R2/R1$$

4. A stable, high-gain solid state DC amplifier circuit according to claim 2 in which a storage capacitor is connected between said output terminal and a third terminal common to both input and output.

5. A stable high-gain solid state DC amplifier circuit according to claim 1 in which said series chopper comprises a field effect transistor having two main electrodes, one connected to the associated amplifier circuit terminal and the other connected to the adjacent AC coupling means, and further having a gate electrode connected to said chopper drive means.

6. A stable high-gain solid state DC amplifier circuit according to claim 1, further comprising a common input-output terminal in which said shunt chopper comprises a field effect transistor having two main electrodes, one connected to the associated amplifier circuit input or output terminal and the other connected to said common terminal, and further having a gate electrode connected to said chopper drive means.

7. A stable high-gain solid state DC amplifier circuit according to claim 1 in which at least one of said chopper means comprises both a series-connected chopper and a shunt-connected chopper, both connected to the same terminal of the amplifier circuit, and each comprising a single field effect transistor.